United States Patent [19]
Burrows et al.

[11] Patent Number: 5,917,280
[45] Date of Patent: Jun. 29, 1999

[54] STACKED ORGANIC LIGHT EMITTING DEVICES

[75] Inventors: Paul Burrows; Stephen R. Forrest, both of Princeton, N.J.

[73] Assignee: The Trustees of Princeton University, Princeton, N.J.

[21] Appl. No.: 08/792,046

[22] Filed: Feb. 3, 1997

[51] Int. Cl.$^6$ ........................................... H01J 1/62
[52] U.S. Cl. .................... 313/506; 313/503; 313/509; 345/4; 345/79; 345/76
[58] Field of Search ..................... 313/504, 506, 313/509; 345/4, 79, 76; 427/64, 66

[56] References Cited

U.S. PATENT DOCUMENTS

| | | |
|---|---|---|
| 4,356,429 | 10/1982 | Tang . |
| 4,670,689 | 6/1987 | Suzuki . |
| 4,908,603 | 3/1990 | Yamaue et al. . |
| 5,122,711 | 6/1992 | Wakimoto et al. . |
| 5,291,098 | 3/1994 | Okita et al. . |
| 5,416,494 | 5/1995 | Yokota et al. ........................ 313/506 |
| 5,427,858 | 6/1995 | Nakamura et al. . |
| 5,505,985 | 4/1996 | Nakamura et al. . |
| 5,529,853 | 6/1996 | Hamada et al. . |
| 5,703,436 | 12/1997 | Forrest et al. ........................ 313/506 |

OTHER PUBLICATIONS

Garbuzov et al., "Photoluminescence efficiency and absorption of aluminum–tris–quinolate ($Alq_3$) thin films", Chemical Physics Letters 249 (1996) 433–437.

Baigent et al., "Conjugated polymer light–emitting diodes on silicon substrates", Appl. Phys. Lett. 65 (21), Nov. 21, 1994, 2636–2638.

Burrows et al., "Reliability and degradation of organic light emitting devices", Appl. Phys. Lett. 65 (23), Dec. 5, 1994, 2922–2924.

Garbuzov et al., "Organic films deposited on Si p–n junctions: Accurate measurements of fluoescence internal efficiency, and application to luminescent antireflection coatings", Journal of Applied Physics, vol. 80, No. 8, Oct. 15, 1996, 4644–4648.

*Primary Examiner*—Nimeshkumar D. Patel
*Attorney, Agent, or Firm*—Kenyon & Kenyon

[57] ABSTRACT

Arrangements for biasing the individual light emitting elements of a stacked organic light emitting device (SOLED). A circuit is provided for independently driving the individual OLEDs in a conventional SOLED having one electrode coupled to ground potential and one further electrode for each of the OLEDs in the stack. Additionally, new SOLED structures are described in which each OLED in the stack is provided with a ground reference. A SOLED combining upright and inverted OLEDs is also described.

64 Claims, 4 Drawing Sheets

STACKED ORGANIC LIGHT EMITTING DEVICES

FIELD OF THE INVENTION

The present invention relates to the field of light emitting devices, in particular, to stacked organic light emitting devices (SOLEDs) and to means for driving same.

BACKGROUND INFORMATION

Organic light emitting devices (OLEDs) are light emitting devices which use organic electroluminescent (EL) materials excited by electric current to emit light. A plurality of OLEDs can be arranged in an array to form a display.

In color displays, it is necessary to arrange OLEDs which emit light of different colors, typically the primary colors blue, green and red, in close proximity to each other. In such an application, it is advantageous to arrange three OLEDs, each emitting light of one of the three primary colors, in a stack, thereby forming a true color pixel from which any color can be emitted. Such a structure is described in PCT International Application WO 96/19792.

In such a stacked structure, one electrode layer is provided at the bottom of the SOLED stack and a further electrode layer is provided between each of the OLEDs in the stack and on top of the uppermost OLED in the stack. The bottom electrode layer is typically coupled to a ground reference and the intermediate and top electrode layers are coupled to either a positive or negative driving voltage.

With only one electrode layer being provided in the SOLED for coupling to a ground reference and with only one additional electrode layer being provided for each OLED in the stack, the problem arises of driving each of the OLEDs in the stack independently of each other. There is therefore a need for a means of driving such a configuration of stacked OLEDs or for alternative configurations of stacked OLEDs.

SUMMARY OF THE INVENTION

The present invention is directed to arrangements for independently driving individual OLEDs arranged in a stacked OLED structure, or SOLED.

For a conventional SOLED in which only one electrode is provided between each OLED in the stack and in which only one electrode, arranged at the bottom of the stack, is coupled to ground potential, the present invention provides a driving circuit which generates voltages for application to the electrodes arranged between the OLEDs in accordance with input control signals applied to the driving circuit. The brightness of the light emitted by each OLED of the SOLED is controlled by the driving circuit in accordance with a respective one of the input control signals so that there is a direct correspondence between the level of an input control signal and the brightness of the light emitted by the corresponding OLED.

The present invention also provides embodiments of SOLED structures which allow direct control of the individual OLEDs in the stacked structure with no additional external circuitry.

In a first such embodiment, each OLED is provided with a first electrode coupled to a ground reference and a second electrode coupled to either a positive or negative driving voltage. An insulating layer is provided between adjacent electrodes of two of the OLEDs in the stack.

In a further embodiment, each OLED in the stack is provided with a first electrode for coupling to a ground reference and a second electrode for coupling to a positive driving voltage. An insulating layer is provided between adjacent electrodes of two of the OLEDs in the stack. In addition, the middle OLED is formed with an inverted structure. In this embodiment, only driving voltages of the same polarity are required, thereby avoiding the need for a dual-polarity voltage source.

In a third embodiment, only one electrode layer is coupled to ground potential. Each OLED is directly controlled and no insulating layers are required. The middle OLED is formed with an inverted structure. Only voltages of the same polarity are required.

The circuit and SOLEDs of the present invention can be used in a wide variety of applications, including computer displays, informational displays in vehicles, television monitors, telephones, printers, illuminated signs, large-area screens and billboards.

DETAILED DESCRIPTION

Figure 1:
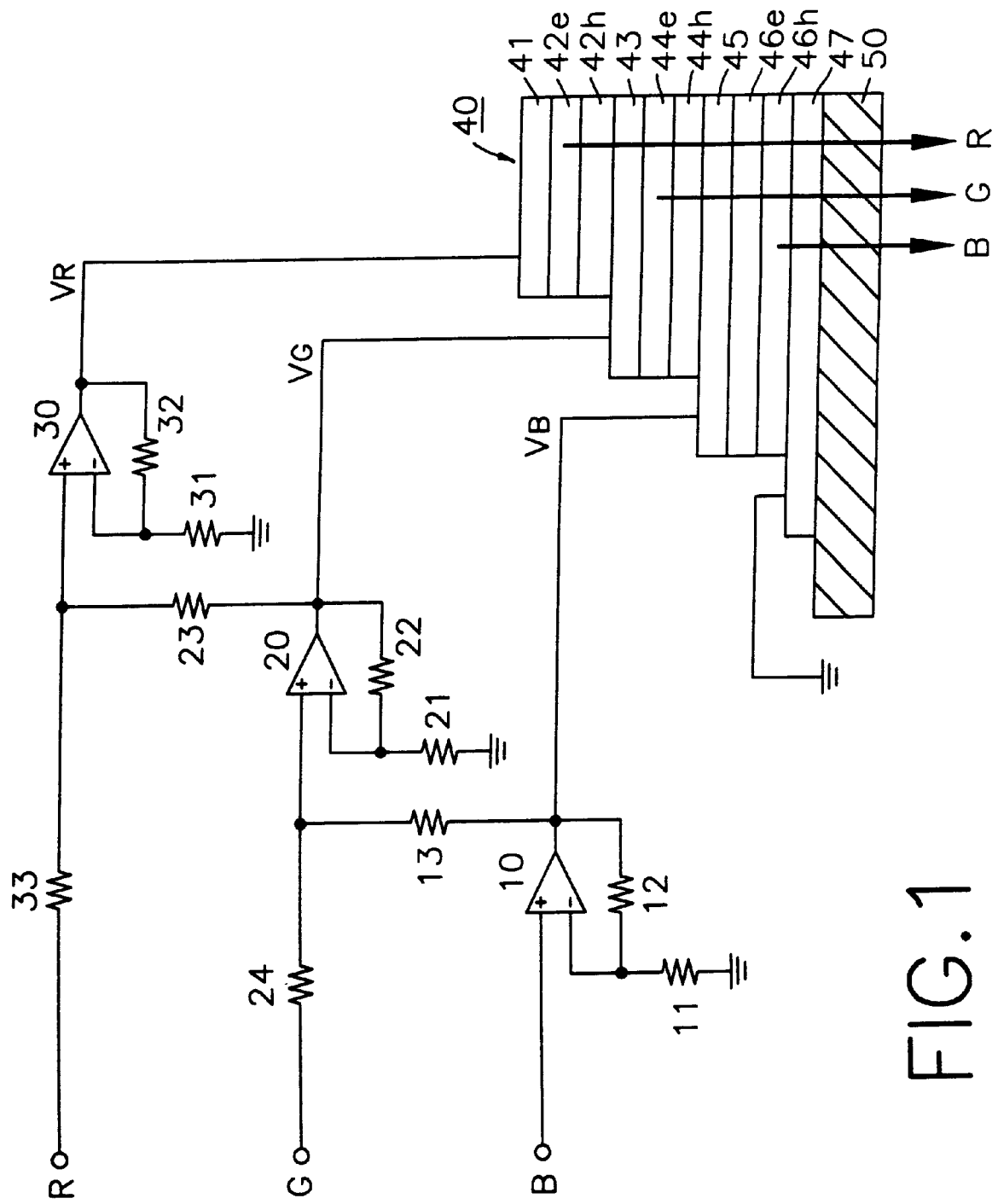
FIG. 1 shows an exemplary embodiment of a circuit for driving a conventional stacked OLED structure in accordance with the present invention.

FIG. 1 shows an exemplary embodiment of a circuit for driving a stacked OLED (SOLED) structure 40. The SOLED structure of FIG. 1 includes three OLEDs, each emitting one of a red, green and blue light, represented by arrows labeled R, G and B, respectively. For the purposes of the present invention, the actual colors emitted is irrelevant. The primary colors red, green and blue are preferred in the typical display applications utilizing SOLEDs so as to allow all possible color combinations. Furthermore, although a red OLED is shown stacked on a green OLED which in turn is stacked on a blue OLED, any order of stacking is possible. The SOLED 40 can be fabricated as disclosed in U.S. patent applications Ser. Nos. 08/354,674 and 08/613,207, incorporated herein by reference in their entirety.

The circuit for driving the OLED stacked structure includes three drivers 10, 20 and 30 which can be implemented, as shown, with operational amplifiers (op-amps). Each of the drivers 10, 20 and 30 has an input coupled to a terminal, B, G or R, respectively, to which is applied a control signal indicative of the desired brightness of the light to be emitted by a corresponding one of the OLEDs in the stacked OLED structure 40.

The stacked OLED structure 40 is fabricated on a substrate 50 which is composed of a substantially transparent material such as glass. The bottom layer of the stacked structure 40 is an electrode layer 47. In the exemplary embodiment of FIG. 1, the electrode layer 47 acts as an anode and is coupled to ground. A first OLED which emits blue light is arranged over the electrode layer 47. The first OLED comprises a layer 46$h$ of organic material which acts as a hole transporting layer (HTL). The HTL 46$h$ is deposited on the electrode layer 47. A further organic layer 46e which acts as an electron transporting layer (ETL) as well as an electroluminescent layer (EL) is deposited on the HTL 46h. The ETL and EL can alternatively be implemented as two distinct layers. A semi-transparent electrode layer 45 is deposited on the ETL/EL 46e.

A second OLED which emits green light is fabricated over the first OLED. The second OLED, which is similar in fabrication to the first OLED, comprises a HTL 44h which is deposited on the electrode layer 45 and an ETL/EL 44e which is deposited on the HTL 44h. A semi-transparent electrode layer 43 is deposited on the ETL/EL 44e.

A third OLED which emits red light is fabricated over the second OLED. The third OLED, which is similar in fabrication to the first and second OLEDs, comprises a HTL 42h which is deposited on the electrode layer 43 and an ETL/EL 42e which is deposited on the HTL 42h. An opaque or semitransparent electrode layer 41 is deposited on the ETL/EL 42e.

The electrode 45, which lies between the first and second OLEDs, is coupled to the output of the driver 10. The driver 10 generates a voltage $V_B$ which drives the first OLED. The brightness of the blue light emitted by the first OLED is controlled by the magnitude of the voltage $V_B$.

The electrode 43, which lies between the second and third OLEDs, is coupled to the output of the driver 20. The driver 20 generates a voltage $V_G$ which in conjunction with the voltage $V_B$ determines the brightness of the green light emitted by the second OLED. More specifically, the brightness of the light emitted by the second OLED is a function of the voltage applied across the second OLED. The voltage applied across the second OLED is the voltage between the electrodes 43 and 45, or $V_G-V_B$.

The electrode 41, which lies over the third OLED, is coupled to the output of the driver 30. The driver 30 generates a voltage $V_R$ which in conjunction with the voltage $V_G$ determines the brightness of the red light emitted by the third OLED. The brightness of the light emitted by the third OLED is a function of the voltage applied across the third OLED, namely, the voltage between the electrodes 41 and 43, or $V_R-V_G$.

In conjunction with resistors 11 and 12, the op-amp 10 is configured so that the voltage $V_B$ generated by the op-amp 10 is equal or proportionate to the voltage of the control signal applied to the terminal B. The resistor 11 is coupled between an inverting input of the op-amp 10 and ground and the resistor 12 is coupled between the inverting input and the output of the op-amp 10. The closed-loop gain of the op-amp 10 thus configured is determined by the values of the resistors 11 and 12. More specifically:

$$V_B=(1+R_{12}/R_{11})V(B),$$

where $R_{11}$ and $R_{12}$ are the values of the resistors 11 and 12, respectively, and V(B) is the voltage of the input control signal applied to terminal B. If resistor 12 is replaced by a short circuit, then $V_B$=V (B), i.e., the brightness of the blue OLED is determined by the voltage applied to the control terminal B.

In conjunction with resistors 13, 21, 22 and 24, the op-amp 20 can be configured so that the voltage $V_G$ generated by the op-amp 20 can be made proportionate to the sum of $V_B$ and the voltage applied to the terminal G (V(G)). The terminal G, to which the control signal for the green OLED is applied, is coupled via the resistor 24 to a non-inverting input of the op-amp 20. The output of the op-amp 10 is coupled to the noninverting input of the op-amp 20 via the resistor 13. The resistor 21 is coupled between an inverting input of the op-amp 20 and ground and the resistor 22 is coupled between the inverting input and the output of the op-amp 20. In this configuration, the driver 20 acts as a summing amplifier. If the values of the resistors 13 and 24 are selected to be equal, then:

$$V_G=\frac{1}{2}(1+R_{22}/R_{21})[V(G)+V_B].$$

Furthermore, if the values of the resistors 21 and 22 are selected to be equal, then $V_G$=V(G)+$V_B$, in which case the voltage applied across the green OLED, $V_G-V_B$, is equal to V(G). In this case, the brightness of the green OLED is controlled only by the voltage of the signal applied to the terminal G.

The driver 30 is configured with resistors 23, 31, 32 and 33 to operate similarly to driver 20. If the values of resistors 23 and 33 are selected to be equal to each other and the values of the resistors 31 and 32 are selected to be equal to each other, then the voltage applied across the red OLED is equal to V(R), the voltage of the control signal applied to the terminal R. In this case, the brightness of the red OLED is controlled only by the voltage applied to the terminal R.

As a result, the brightness of the light emitted by each of the OLEDs in the stacked structure 40 can be controlled independently of the brightness of the other OLEDs, thus providing a transparent control of the individual OLEDs of the SOLED from the corresponding input control signals.

It should be noted that if the nominal driving voltage for an individual OLED in the stacked structure is Vd (typically approximately 10 volts), the magnitude of the voltage $V_R$ applied to the electrode 41 can be as great as 3 Vd (30 volts). As such, the driver 30 must be capable of developing an output voltage of 3 Vd and thus must be powered with a supply voltage of 3 Vd or greater.

Note that in the exemplary embodiment of FIG. 1, the voltages $V_B$, $V_G$ and $V_R$ for driving the OLEDs are negative in polarity. This is due to the ordering of the organic layers of the individual OLEDs and the grounding of the bottom electrode 47. It should be evident that the circuit of FIG. 1 is also applicable to SOLEDs which require positive driving voltages (as in the case in which the ETL/EL and HTL of each OLED are reversed). Moreover, the circuit of FIG. 1 can be readily adapted to operate with input control signals of either positive or negative polarity.

Figure 2:
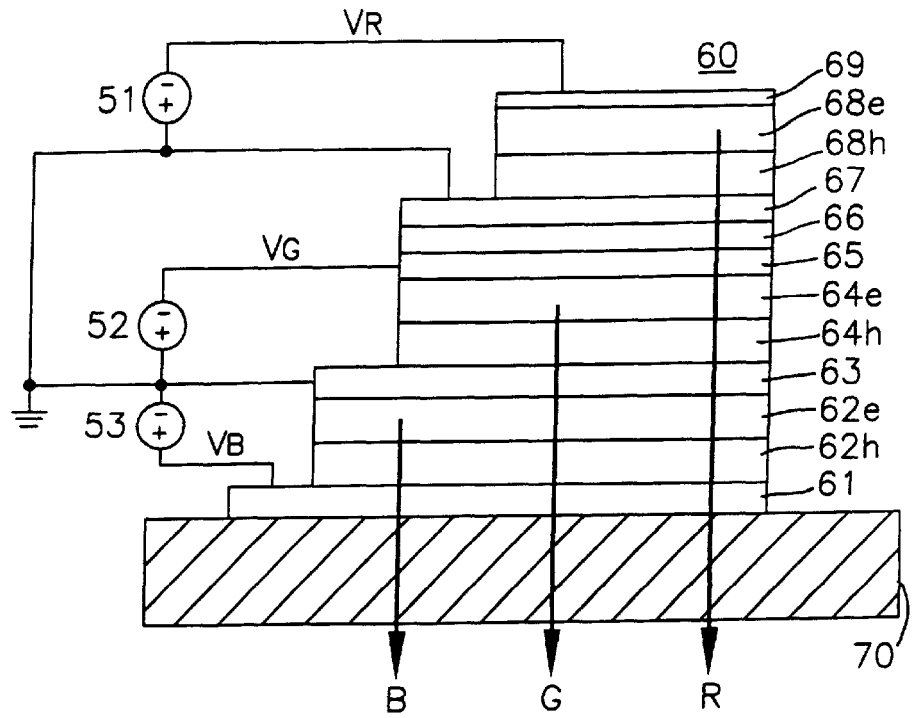
FIG. 2 shows a first embodiment of a stacked OLED structure in accordance with the present invention.

FIG. 2 shows an embodiment of a stacked OLED structure 60 in which each of the OLEDs in the stack is provided with a ground reference. In this embodiment, the individual OLEDs in the stack can be controlled independently of each other without additional external circuitry such as that of FIG. 1. In this embodiment, the voltages $V_R$, $V_G$ and $V_B$ for driving the respective OLEDs in the SOLED are represented by voltage sources 51, 52 and 53, respectively.

The stacked OLED structure 60 of FIG. 2 is fabricated on a substantially transparent substrate 70. The first layer deposited on the substrate 70 is an electrode layer 61 which acts as the anode for the blue OLED. The anode layer 61, which can be composed of indium tin oxide (ITO), receives the voltage $V_B$, which in this embodiment is positive, for driving the blue OLED. The organic layers of the blue OLED include an ETL/EL 62e and a HTL 62h which is deposited over the anode layer 61. An electrode layer 63 is deposited on the ETL/EL 62e. The electrode layer 63, which can be formed by depositing a thin, semi-transparent layer of Mg:Ag alloy followed by a layer of ITO, is connected to ground potential.

A HTL 64h for the green OLED is deposited over the electrode layer 63 and an ETL/EL 64e is deposited on the HTL 64h. An electrode layer 65, composed of ITO and a thin layer of Mg:Ag alloy is deposited on the HTL 64h. The electrode layer 65 receives the voltage $V_G$, which in this embodiment is negative, for driving the green OLED and acts as the cathode of the green OLED. It should be noted that the electrode layer 63, which acts as the cathode of the blue OLED also acts as the anode of the green OLED.

An insulating layer 66 is deposited over the cathode layer 65. The insulating layer can be composed of an insulating material such a $SiO_2$, $SiN_x$ or $AlO_2$ deposited by a variety of processes such as plasma enhanced chemical vapor deposition (PECVD), e-beam, etc. An electrode layer 67, which can be composed of ITO, is deposited over the insulating layer 66. The electrode layer 67, which acts as the anode of the red OLED, is connected to ground potential. A HTL 68h of the red OLED is deposited over the electrode layer 67 and an ETL/EL 68e is deposited over the HTL 68h. An electrode layer 69 which acts as the cathode of the red OLED and which can be composed of an Mg:Ag alloy, is deposited over the ETL/EL 68. The electrode layer 69 receives the voltage $V_R$, which in this embodiment is negative, for driving the red OLED.

In the embodiment of FIG. 2, the electrode layer 67 is coupled to ground and the electrode layer 69 is coupled to a negative voltage. In the alternative, it is also possible to couple the electrode layer 69 to ground and to couple the electrode layer 67 to a positive voltage.

Furthermore, in the embodiment of FIG. 2, the order of deposition of the hole transporting layer and the electron transporting and electroluminescent layer is the same for all three of the OLEDs in the stack. Namely, in each case, the electron transporting and electroluminescent layer is deposited over the hole transporting layer. It should be evident that a reverse ordering is also possible, i.e., the hole transporting layer is deposited over the electron transporting and electroluminescent layer.

Figure 2A:
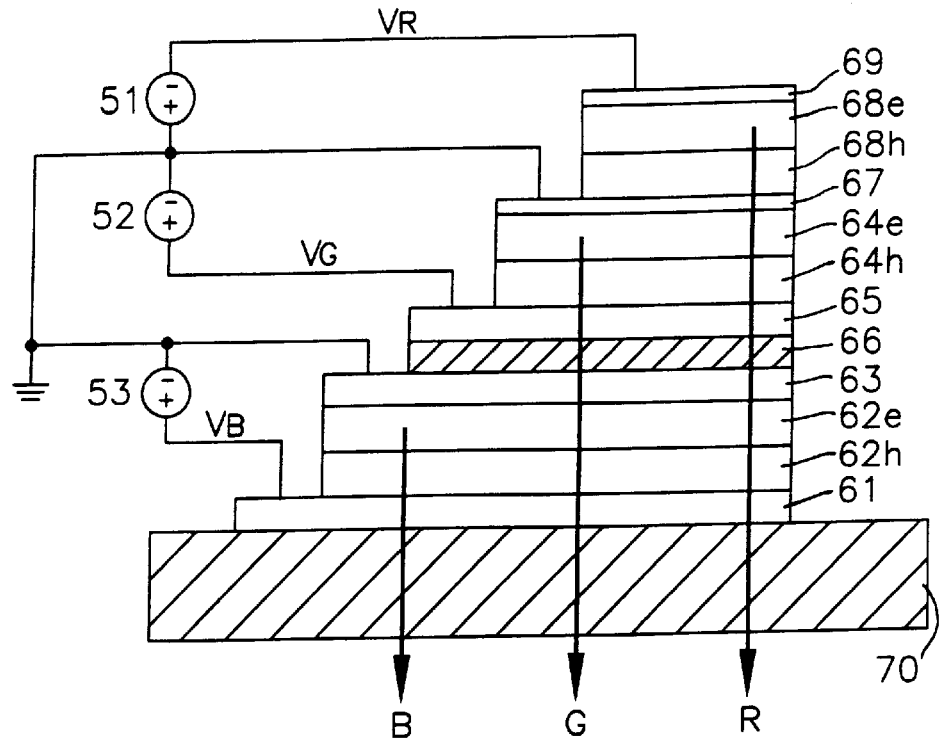
FIG. 2A shows a modification of the embodiment of FIG. 2.

Moreover, in the embodiment of FIG. 2, the insulating layer 66 is arranged between electrode layers arranged between the middle and upper OLEDs. The embodiment of FIG. 2, however, can be readily modified so that the insulating layer is instead arranged between electrodes arranged between the lower and middle OLEDs. FIG. 2A shows such an embodiment.

Figure 3:
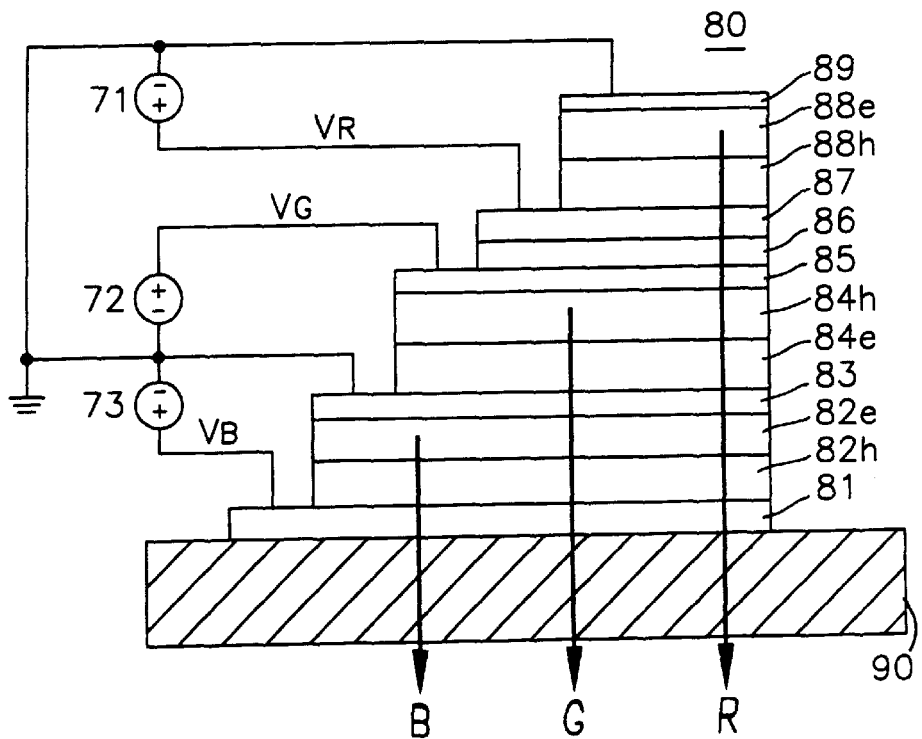
FIG. 3 shows a second embodiment of a stacked OLED structure in accordance with the present invention.

FIG. 3 shows a third embodiment of a stacked OLED structure 80 in which each of the OLEDs in the stack is provided with a ground reference. In this embodiment, all of the OLED driving voltages $V_R$, $V_G$ and $V_B$, provided by the voltages sources 71, 72 and 73, respectively, are of the same polarity. In the exemplary embodiment of FIG. 3, the polarities of the driving voltages are positive, although it should be evident that the SOLED structure can be readily adapted for negative driving voltages.

The stacked OLED structure 80 of FIG. 3 is fabricated on a substrate 90. The first layer deposited on the substrate 90 is a layer 81 which acts as the anode for the blue OLED. The anode layer 81, which can be composed of ITO, receives the voltage $V_B$ for driving the blue OLED. A HTL 82h for the blue OLED is deposited over the anode layer 81 and an ETL/EL 82e for the blue OLED is deposited over the HTL 82h. An electrode layer 83 is deposited on the ETL/EL 82e. The electrode layer 83, which can be formed by depositing a thin layer of Mg:Ag alloy followed by a layer of ITO, is connected to ground potential and acts as a cathode for the blue OLED.

An ETL/EL 84e for the green OLED is deposited over the electrode layer 83 and a HTL 84h is deposited over the ETL/EL 84e. Note that the order of the ETL/EL and HTL of the green OLED is opposite to that of the underlying blue OLED. An electrode layer 85, which can be composed of ITO, is deposited on the HTL 84h and acts as the anode for the green OLED. The electrode layer 85 receives the voltage $V_G$ for driving the green OLED. It should be noted that the electrode layer 83, which acts as the cathode for the blue OLED also acts as the cathode for the green OLED.

An insulating layer 86 is deposited over the electrode layer 85. The insulating layer can be composed of an insulating material such a $SiO_2$, $SiN_x$ or $AlO_2$ deposited by a variety of processes such as PECVD, e-beam, etc. A further electrode layer 87 is deposited over the insulating layer 86. The electrode layer 87, which acts as the anode for the red OLED, can be composed of ITO and is connected to the voltage $V_R$ for driving the red OLED. A HTL 88h of the red OLED is deposited over the electrode layer 87 and an ETL/EL 88e is deposited over the HTL 88h. Note that the order of the HTL and ETL/EL of the red OLED is the same as that of the blue OLED and the reverse of that of the green OLED. A cathode layer 89, which can be composed of an Mg:Ag alloy, is deposited over the ETL/EL 88e. The cathode layer 89 is coupled to ground potential.

Figure 3A:
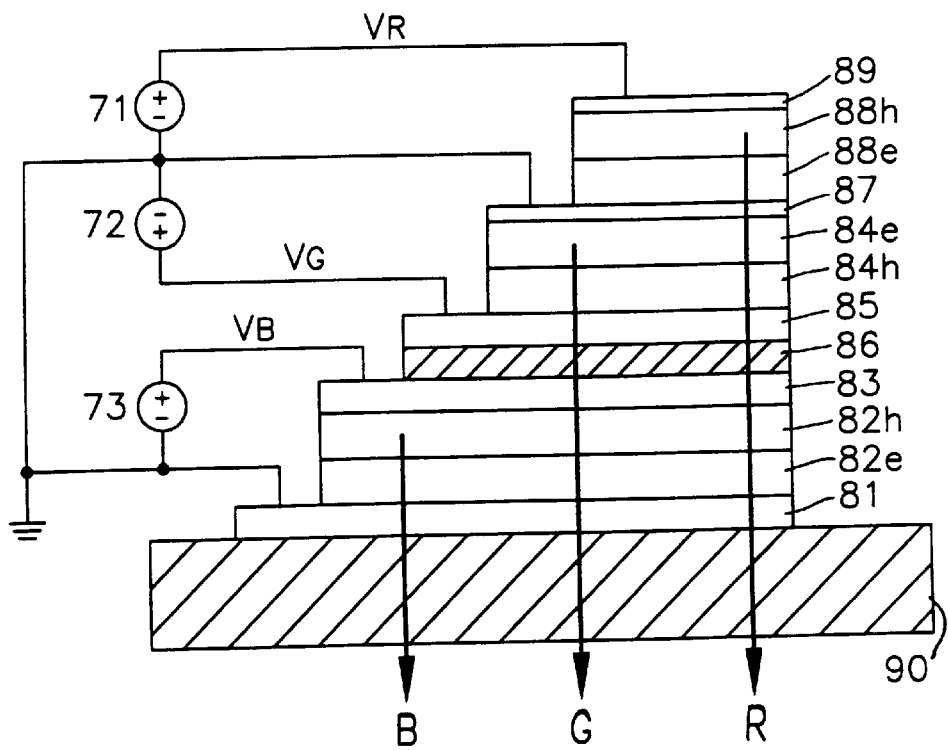
FIG. 3A shows a modification of the embodiment of FIG. 3.

It should be evident that, like the embodiment of FIG. 2, a reverse ordering of the HTL and ETL/EL of each layer is also possible with the embodiment of FIG. 3. Moreover, in the embodiment of FIG. 3, the insulating layer 86 is arranged between electrode layers arranged between the middle and upper OLEDS. The embodiment of FIG. 3, however, can be readily modified so that the insulating layer is instead arranged between electrodes arranged between the lower and middle OLEDS. FIG. 3A shows such an embodiment.

Figure 4:
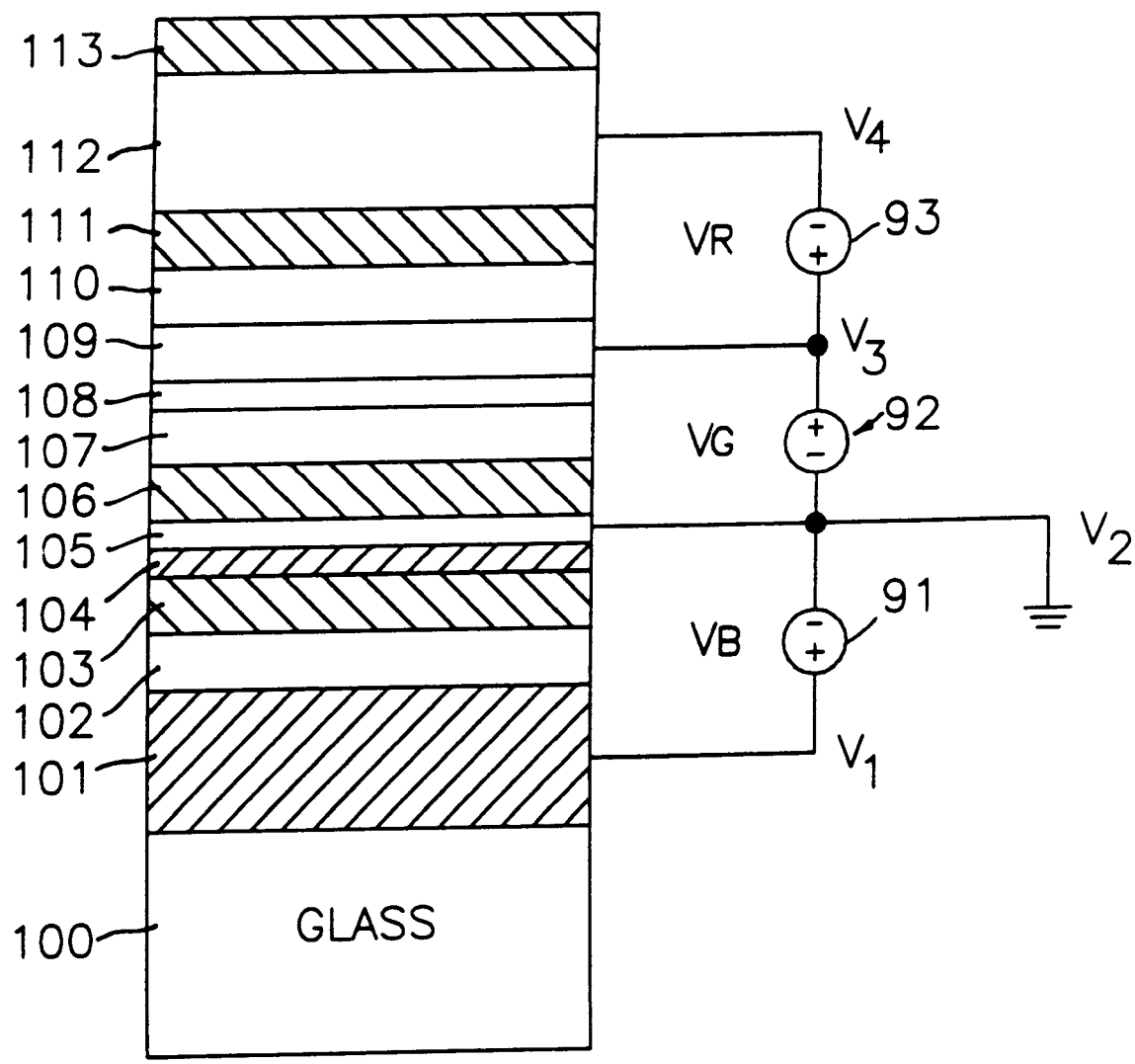
FIG. 4 shows a third embodiment of a stacked OLED structure in accordance with the present invention.

FIG. 4 shows yet another exemplary embodiment of a three-color stacked OLED structure in which only one electrode is tied to ground potential yet, when all OLEDs are on, does not require any voltages greater than that needed to drive one OLED (i.e., Vd).

As shown in FIG. 4, the SOLED is fabricated on a glass substrate 100. An electrode layer 101 is deposited on the substrate 100 as a 1500–4000 Å thick layer of ITO and acts as the anode for the first OLED, which in this embodiment emits blue light. A HTL 102 is deposited on the electrode 101 as a 500 Å thick layer of 4,4'-bis[N-(1-napthyl)-N-phenyl-amino]biphenyl (α-NPD). An electroluminescent layer 103, composed of $Alq_2OPh$ and having a thickness of 100–1000 Å, is deposited on the HTL 102. An ETL 104 composed of tris-(8-hydroxyquinoline) aluminum ($Alq_3$) is deposited with a thickness of 200–800 Å on the electroluminescent layer 103. An electrode layer 105 is deposited on the ETL 104 and acts as the cathode of the blue OLED. The electrode 105 can be composed of an Mg:Ag alloy and can have a thickness of 50–200 Å. The electrode 105 is connected to ground potential. A voltage $V_B$ provided by a voltage source 91 is applied across the electrodes 101 and 105 to drive the blue OLED.

The structure for the second OLED in the stack, which in this embodiment is a green light emitting OLED, is fabricated over the electrode 105. In this embodiment, however, the green OLED is formed in an inverted configuration. An ETL/EL 106, composed of $Alq_3$, is deposited on the electrode 105 to a thickness of 200–800 Å. A HTL 107 is deposited as a 100–1000 Å thick layer of NPD on the ETL/EL 106. A protection layer 108 is deposited on the HTL 107 and an electrode layer 109 composed of ITO is deposited with a thickness of 300–1000 Å on the protection layer 108. The protection layer 108 can be formed by the deposition of 3,4,9,10-perylenetetracarboxilic dianhydride (PTCDA), bis(1,2,5-thiadiazolo)-p-quinobis (1,3-dithiole)

(BTQBT), copper phthalocyanine (CuPc), or other suitable, more rigid organic materials. The thickness of the protection layer 108 can preferably be 50–200 Å. The electrode layer 109 acts as the anode for the green OLED and the electrode layer 105 acts as the cathode. To drive the green OLED, a voltage $V_G$, provided by a voltage source 92, is applied across the electrode layers 109 and 105.

The red OLED is fabricated over the ITO electrode layer 109 in an upright configuration. A NPD HTL 110 with a thickness of 100–1000 Å is deposited on the electrode layer 109 and an $Alq_3$ ETL/EL 111 with a thickness of 200–800 Å is deposited on the HTL 110. A metallic electrode layer 112, composed for instance of a 500–2000 Å thick layer of Mg:Ag alloy, is arranged on the ETL/EL 111 and is capped off with a cap layer 113. The cap layer, which serves to protect the device from oxidation, can be a 500–2000 Å thick layer of silver. The electrode layer 112 acts as the cathode of the red OLED and the electrode layer 109 acts as the anode. To drive the red OLED, a voltage $V_R$, provided by a voltage source 93, is applied across the electrode layers 109 and 112.

In the embodiment of FIG. 4, if the nominal driving voltage for each of the OLEDs in the stack is Vd, when all three OLEDs are driven full on with the voltage Vd, the voltage $V_1$ will be Vd, $V_2$ will be 0 volts, $V_3$ will be Vd and $V_4$ will be substantially 0 volts. If, however, the middle (green) OLED is off while the bottom (blue) and top (red) OLEDs are full on, $V_1$ will be Vd, $V_2$ will be 0 volts, $V_3$ will be substantially 0 volts and $V_4$ will be substantially –Vd. In this case, the voltage difference between $V_2$ and $V_4$ will be substantially Vd-(–Vd) or 2 Vd. This voltage difference, however, can be substantially reduced by keeping the voltage across the off OLED (in this case the green OLED) at the largest voltage at which the OLED will not emit light. If the nominal full-on drive voltage of an OLED is Vd, the threshold voltage below which the OLED will not emit light is approximately 0.8 Vd. If the middle (green) OLED is driven with a voltage at or slightly below 0.8 Vd, so as to keep the middle OLED off, while the top and bottom OLEDs are driven with voltages of Vd, then $V_1$ will be Vd, $V_2$ will be 0 volts, $V_3$ will be substantially 0.8 Vd and $V_4$ will be substantially 0.8 Vd–Vd, or –0.2 Vd. In this case, the voltage difference between $V_2$ and $V_4$ will be Vd-(–0.2 Vd) or 1.2 Vd.

Although the thickness of each layer of the SOLED of FIG. 4 can be within the preferred ranges of thicknesses specified above, the specific thicknesses of the various layers can be advantageously selected to exploit microcavity effects within the stacked structure. Microcavities between layers can be established within the stacked structure to provide filtering of the emitted light. The color of the light emitted by each OLED can thus be adjusted in accordance with the selection of layer thicknesses.

Although detailed compositions and thicknesses of the various layers in a SOLED of the present invention have been described above in connection with the embodiment of FIG. 4, it should be evident that said discussion is also applicable to the other embodiments disclosed herein.

The subject invention as disclosed herein may be used in conjunction with the subject matter of U.S. Pat. No. 5,757,026; 5,721,160; 5,703,436; and 5,707,745, each of which is herein incorporated by reference in its entirety. The subject invention as disclosed herein may also be used in conjunction with the subject matter of U.S. patent applications Ser. No. 08/850,264 (filed Dec. 23, 1996); 08/794,595 (filed Feb. 3, 1997); 08/789,319 (filed Jan. 23, 1997); 08/779,141 (filed Jan. 6, 1997); 08/774,120 (filed Dec. 23, 1996); 08/774,087 (filed Dec. 23, 1996); 08/772,333 (filed Dec. 23, 1996); 08/693,359 (filed Aug. 6, 1996, continuation-in-part of 08/354,674 (U.S. Pat. No. 5,707,745), filed Dec. 13, 1994), each of which is herein incorporated by reference in its entirety.

What is claimed is:

1. A stacked organic light emitting device arranged on a substrate, the device comprising:
    a first electrode arranged on the substrate;
    a first set of organic layers arranged on the first electrode;
    a second electrode arranged on the first set of organic layers;
    a second set of organic layers arranged on the second electrode;
    a third electrode arranged on the second set of organic layers;
    an insulating layer arranged on the third electrode;
    a fourth electrode arranged on the insulating layer;
    a third set of organic layers arranged on the fourth electrode; and
    a fifth electrode arranged on the third set of organic layers.

2. The device of claim 1, wherein each of the first, second and third sets of organic layers includes an electron transporting layer and a hole transporting layer.

3. The device of claim 2, wherein the electron transporting layer includes an electroluminescent layer.

4. The device of claim 2, wherein the electron transporting layer is arranged over the hole transporting layer in each of the first, second and third sets of organic layers.

5. The device of claim 2, wherein the electron transporting layer is arranged over the hole transporting layer in each of the first and third sets of organic layers and wherein the hole transporting layer is arranged over the electron transporting layer in the second set of organic layers.

6. The device of claim 2, wherein the hole transporting layer is arranged over the electron transporting layer in each of the first, second and third sets of organic layers.

7. The device of claim 2, wherein the hole transporting layer is arranged over the electron transporting layer in each of the first and third sets of organic layers and wherein the electron transporting layer is arranged over the hole transporting layer in the second set of organic layers.

8. The device of claim 1, wherein the second and fourth electrodes are coupled to a ground potential.

9. The device of claim 1, wherein the second and fifth electrodes are coupled to a ground potential.

10. The device of claim 1, wherein each of the first, second and third sets of organic layers emits a light of a color selected from the group of colors consisting of blue, green and red.

11. A display incorporating a plurality of light emitting devices in accordance with claim 1.

12. A vehicle incorporating a display including the light emitting device of claim 1.

13. A television incorporating a display including the light emitting device of claim 1.

14. A computer incorporating a display including the light emitting device of claim 1.

15. A printer incorporating the light emitting device of claim 1.

16. A screen incorporating the light emitting device of claim 1.

17. A sign incorporating the light emitting device of claim 1.

18. A telecommunications device incorporating the light emitting device of claim 1.

19. A telephone incorporating the light emitting device of claim 1.

20. The stacked organic light emitting device of claim 1, wherein:

the first electrode is coupled to a first driving voltage;

the second electrode is coupled to a ground reference; and the third electrode is coupled to a second driving voltage, controllable independently of the first driving voltage.

21. A stacked organic light emitting device arranged on a substrate, the device comprising:

a first electrode arranged on the substrate;

a first set of organic layers arranged on the first electrode;

a second electrode arranged on the first set of organic layers;

a second set of organic layers arranged on the second electrode;

a third electrode arranged on the second set of organic layers;

a third set of organic layers arranged on the third electrode; and a fourth electrode arranged on the third set of organic layers;

wherein at least one set of organic layers selected from the group consisting of the first set of organic layers, the second set of organic layers, and the third set of organic layers is inverted; and wherein at least one set of organic layers selected from the group consisting of the first set of organic layers, the second set of organic layers, and the third set of organic layers is not inverted.

22. The device of claim 21, wherein each of the first, second and third sets of organic layers includes an electron transporting layer and a hole transporting layer.

23. The device of claim 22, wherein the electron transporting layer includes an electroluminescent layer.

24. The device of claim 22, wherein the electron transporting layer of the second and third sets of organic layers includes an electroluminescent layer and the first set of organic layers includes an electroluminescent layer arranged between the electron transporting layer and the hole transporting layer of the first set of organic layers.

25. The device of claim 22, wherein the electron transporting layer is arranged over the hole transporting layer in each of the first and third sets of organic layers and wherein the hole transporting layer is arranged over the electron transporting layer in the second set of organic layers.

26. The device of claim 22, wherein the hole transporting layer is arranged over the electron transporting layer in each of the first and third sets of organic layers and wherein the electron transporting layer is arranged over the hole transporting layer in the second set of organic layers.

27. The device of claim 21, wherein the second set of organic layers includes a protection layer arranged adjacent to the third electrode.

28. The device of claim 21, wherein the second electrode is coupled to a ground potential.

29. The device of claim 21, wherein each of the first, second and third sets of organic layers emits a light of a color selected from the group of colors consisting of blue, green and red.

30. The device of claim 21, wherein the first and third electrodes include indium tin oxide and the second and fourth electrodes include a metal.

31. The device of claim 21, further comprising a cap arranged on the fourth electrode.

32. A display incorporating a plurality of light emitting devices in accordance with claim 21.

33. A vehicle incorporating a display including the light emitting device of claim 21.

34. A television incorporating a display including the light emitting device of claim 21.

35. A computer incorporating a display including the light emitting device of claim 21.

36. A printer incorporating the light emitting device of claim 21.

37. A screen incorporating the light emitting device of claim 21.

38. A sign incorporating the light emitting device of claim 21.

39. A telecommunications device incorporating the light emitting device of claim 21.

40. A telephone incorporating the light emitting device of claim 21.

41. A stacked organic light emitting device arranged on a substrate, the device comprising:

a first electrode arranged on the substrate;

a first set of organic layers arranged on the first electrode;

a second electrode arranged on the first set of organic layers;

an insulating layer arranged on the second electrode;

a third electrode arranged on the insulating layer;

a second set of organic layers arranged on the third electrode;

a fourth electrode arranged on the second set of organic layers;.

a third set of organic layers arranged on the fourth electrode; and a fifth electrode arranged on the third set of organic layers.

42. The device of claim 41, wherein each of the first, second and third sets of organic layers includes an electron transporting layer and a hole transporting layer.

43. The device of claim 42, wherein the electron transporting layer includes an electroluminescent layer.

44. The device of claim 42, wherein the electron transporting layer is arranged over the hole transporting layer in each of the first, second and third sets of organic layers.

45. The device of claim 42, wherein the electron transporting layer is arranged over the hole transporting layer in each of the first and third sets of organic layers and wherein the hole transporting layer is arranged over the electron transporting layer in the second set of organic layers.

46. The device of claim 42, wherein the hole transporting layer is arranged over the electron transporting layer in each of the first, second and third sets of organic layers.

47. The device of claim 42, wherein the hole transporting layer is arranged over the electron transporting layer in each of the first and third sets of organic layers and wherein the electron transporting layer is arranged over the hole transporting layer in the second set of organic layers.

48. The device of claim 41, wherein the second and fourth electrodes are coupled to a ground potential.

49. The device of claim 41, wherein each of the first, second and third sets of organic layers emits a light of a color selected from the group of colors consisting of blue, green and red.

50. A display incorporating a plurality of light emitting devices in accordance with claim 41.

51. A vehicle incorporating a display including the light emitting device of claim 41.

52. A television incorporating a display including the light emitting device of claim 41.

53. A computer incorporating a display including the light emitting device of claim 41.

54. A printer incorporating the light emitting device of claim 41.

55. A screen incorporating the light emitting device of claim 41.

56. A sign incorporating the light emitting device of claim 41.

57. A telecommunications device incorporating the light emitting device of claim 41.

58. A telephone incorporating the light emitting device of claim 41.

59. The stacked organic light emitting device of claim 41, wherein:

the third electrode is coupled to a first driving voltage;

the fourth electrode is coupled to a ground reference; and the fifth electrode is coupled to a second driving voltage, controllable independently of the first driving voltage.

60. A method for producing a stacked organic light emitting device on a substrate, comprising the steps of:

depositing a first electrode on the substrate;

depositing a first set of organic layers on the first electrode;

depositing a second electrode on the first set of organic layers;

depositing a second set of organic layers on the second electrode;

depositing a third electrode on the second set of organic layers;

depositing an insulating layer on the third electrode;

depositing a fourth electrode on the insulating layer;

depositing a third set of organic layers on the fourth electrode; and depositing a fifth electrode on the third set of organic layers.

61. The method of claim 60, further comprising the steps of:

coupling the first electrode to a first driving voltage;

coupling the second electrode to a ground reference; and coupling the third electrode to a second driving voltage, controllable independently of the first driving voltage.

62. A method for producing a stacked organic light emitting device on a substrate, comprising the steps of:

depositing a first electrode on the substrate;

depositing a first set of organic layers on the first electrode;

depositing a second electrode on the first set of organic layers;

depositing a second set of organic layers on the second electrode;

depositing a third electrode on the second set of organic layers;

depositing a third set of organic layers on the third electrode; and depositing a fourth electrode on the third set of organic layers;

wherein at least one set of organic layers selected from the group consisting of the first set of organic layers, the second set of organic layers, and the third set of organic layers is inverted; and wherein at least one set of organic layers selected from the group consisting of the first set of organic layers, the second set of organic layers, and the third set of organic layers is not inverted.

63. A method for producing a stacked organic light emitting device on a substrate, comprising the steps of:

depositing a first electrode on the substrate;

depositing a first set of organic layers on the first electrode;

depositing a second electrode on the first set of organic layers;

depositing an insulating layer on the second electrode;

depositing a third electrode on the insulating layer;

depositing a second set of organic layers on the third electrode;

depositing a fourth electrode on the second set of organic layers;

depositing a third set of organic layers on the fourth electrode; and depositing a fifth electrode on the third set of organic layers.

64. The method of claim 63, further comprising the steps of:

coupling the third electrode to a first driving voltage;

coupling the fourth electrode to a ground reference; and coupling the fifth electrode to a second driving voltage, controllable independently of the first driving voltage.

* * * * *

UNITED STATES PATENT AND TRADEMARK OFFICE
CERTIFICATE OF CORRECTION

PATENT NO. : 5,917,280
DATED : June 29, 1999
INVENTOR(S) : Paul BURROWS and Stephen R. FORREST It is certified that error appears in the above-identified patent and that said Letters Patent is hereby corrected as shown below:

Column 1, line 3, insert the following paragraph after the title:

-- GOVERNMENT RIGHTS

This invention was made with Government support under Contract No. F33615-94-1-1414 awarded by DARPA. The government has certain rights in this invention.--

Signed and Sealed this

Fifth Day of September, 2000

Attest:

Q. TODD DICKINSON

*Attesting Officer*   *Director of Patents and Trademarks*